(12) United States Patent
Koushik et al.

(10) Patent No.: US 8,482,318 B2
(45) Date of Patent: Jul. 9, 2013

(54) HIGH-SPEED CURRENT SWITCHING

(75) Inventors: K R Srinidhi Koushik, Bangalore (IN);
Lavanya M. Nirikhi, Bangalore (IN);
Katragadda Anandaram, Bangalore (IN); Santosh M. Narawade, Bangalore (IN)

(73) Assignee: Sasken Communication Technologies Ltd, Bangalore (IN)

( * ) Notice: Subject to any disclaimer, the term of this patent is extended or adjusted under 35 U.S.C. 154(b) by 254 days.

(21) Appl. No.: 12/848,423

(22) Filed: Aug. 2, 2010

(65) Prior Publication Data

US 2011/0298525 A1 Dec. 8, 2011

(30) Foreign Application Priority Data

Jun. 4, 2010 (IN) .......................... 1552/CHE/2010

(51) Int. Cl.
*H03K 3/00* (2006.01)

(52) U.S. Cl.
USPC .......................................................... 327/108

(58) Field of Classification Search
None
See application file for complete search history.

(56) References Cited

U.S. PATENT DOCUMENTS

| | | | | |
|---|---|---|---|---|
| 6,982,601 B2 * | 1/2006 | Sibrai | ........................... | 330/288 |
| 7,579,880 B2 * | 8/2009 | Ueda | ........................... | 327/108 |

* cited by examiner

*Primary Examiner* — Lincoln Donovan
*Assistant Examiner* — Khareem E Almo

(57) ABSTRACT

A method and circuit for high-speed current switching includes altering the operating voltage of the Current Source using a resistor in non-transmission mode, turning parasitic capacitive coupling into an advantage for faster settling of CS gate bias voltage. The resistor is designed to compensate for the voltage coupling when the Current Source is switched to Transmit mode. This greatly improves the settling time of current and bias voltage of the Current Source transistor without adding any complex circuit and saves 100% of power consumed in non-transmit mode.

30 Claims, 3 Drawing Sheets

HIGH-SPEED CURRENT SWITCHING

TECHNICAL FIELD

The embodiments herein relate to integrated circuits and, more particularly, to switching in integrated circuits.

BACKGROUND

Low power is one of the main desirable features of portable communication appliances and high-speed links. Ideally, zero current consumption in standby or OFF mode greatly contributes to the 'low power' tag of a device. In addition to this, low power also refers to the speed and accuracy with which a circuit can resume normal mode of operation. Thus, fast switching is crucial to both, reducing power and enhancing dynamic performance of high-speed links. These links predominantly use current mode transmission and hence their power consumption and dynamic performance is dictated by the high-speed current switching. High-speed switching of large current sources is difficult due to huge parasitic capacitances associated with the circuit.

Settling time taken by the gate bias voltage of the current source when the current source is turned ON/OFF is further delayed by capacitive coupling between gate and drain terminals. Thus, the circuits do not meet the specified signal amplitude and timing specification of standards such as USB 2.0. This leaves designers with two options; either to keep the current source in ON state even in non transmission mode or to design a circuit for faster settling of the current source's bias voltage after switching. The first option makes the circuit power hungry while the design of the circuit as in option two, in itself is a challenge to the designer.

Current Source can be turned OFF by pulling the gate terminal to the supply voltage or by making the output path (or drain terminal), high impedance. Pulling the gate terminal takes a long time to bring the bias voltage to its actual value. So, it needs higher bias current to handle huge capacitance at the gate terminal to keep the settling time within limits. In case of increasing impedance, a sudden change in the drain voltage is coupled to gate, altering the bias voltage. The gate-drain capacitance is at its highest when transistor is operating in deep-linear region. Therefore, when the capacitance starts increasing, coupling at gate can be as high as half the voltage change at drain. This significantly dips down the voltage at gate terminal, giving rise to current higher than actual current.

SUMMARY

In view of the foregoing, an embodiment herein provides a high-speed current switch circuit comprising of a Current Source transistor, whose gate is connected to gate and drain terminals of a Current mirroring transistor. Further the circuit comprises of a resistive element, (a transistor used as resistor) whose drain is connected to the gate (node $P_{bias}$) of Current Source transistor, gate terminal to a control signal and source terminal to the drain (node $P_{drain}$) of the Current Source transistor. The drain of the Current Source transistor is connected to the drains of two current routing transistors. The two current routing transistors route current to the respective resistors connected to their source terminal depending upon the gate inputs generated from the Transmit logic. The resistive element, the Current Source transistor and the current mirroring transistor in the high-speed current switch circuit can be Metal Oxide Field Effect Transistors (MOSFETs). The control signal is a transmit enable signal.

Embodiments further disclose a high-speed current switch circuit comprising of a Current Source transistor, whose gate is connected to gate and drain terminals of a Current mirroring transistor. Further the circuit comprises of a transistor used as a switch whose drain is connected to a resistor, gate terminal to a control signal and source terminal to the drain of the Current Source transistor (node $P_{drain}$). The other terminal of the resistor is connected to the gate of the Current Source transistor, (node $P_{bias}$). The drain of the Current Source transistor is connected to the drains of two current routing transistors. The two current routing transistors route current to the respective resistors and are connected to their source terminal depending upon the gate inputs generated from a Transmit logic block. The switch transistor, current Source transistor and the current mirroring transistor in the high-speed current switch circuit can be Metal Oxide Field Effect Transistors (MOSFET). The control signal is a transmit enable signal.

Embodiments further disclose a high-speed current switch circuit comprising of a Current Source transistor, whose gate is connected to gate and drain terminals of a Current mirroring transistor. Further the circuit comprises of a transistor used as a switch whose drain is connected to a resistor, gate terminal to a control signal and source terminal to the drain of the Current Source transistor (node $P_{drain}$). The other terminal of the resistor is connected to the gate of the Current Source transistor, (node $P_{bias}$). A transistor, with its source connected to the drain terminal of the Current Source, gate terminal to the logical invert of the Control Signal, drain connected to drains of two current routing transistors acts as a cascode to the Current Source. The two current routing transistors route current to the respective resistors, are connected to their source terminal depending upon the gate inputs generated from a Transmit logic block. The switch transistor, Current Source transistor, current mirroring transistor and the Cascode transistor in the high-speed current switch circuit can be Metal Oxide Field Effect Transistors (MOSFETs).

These and other aspects of the embodiments herein will be better appreciated and understood when considered in conjunction with the following description and the accompanying drawings.

BRIEF DESCRIPTION OF THE FIGURES

The embodiments herein will be better understood from the following detailed description with reference to the drawings, in which.

DETAILED DESCRIPTION OF EMBODIMENTS

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Figure 1:
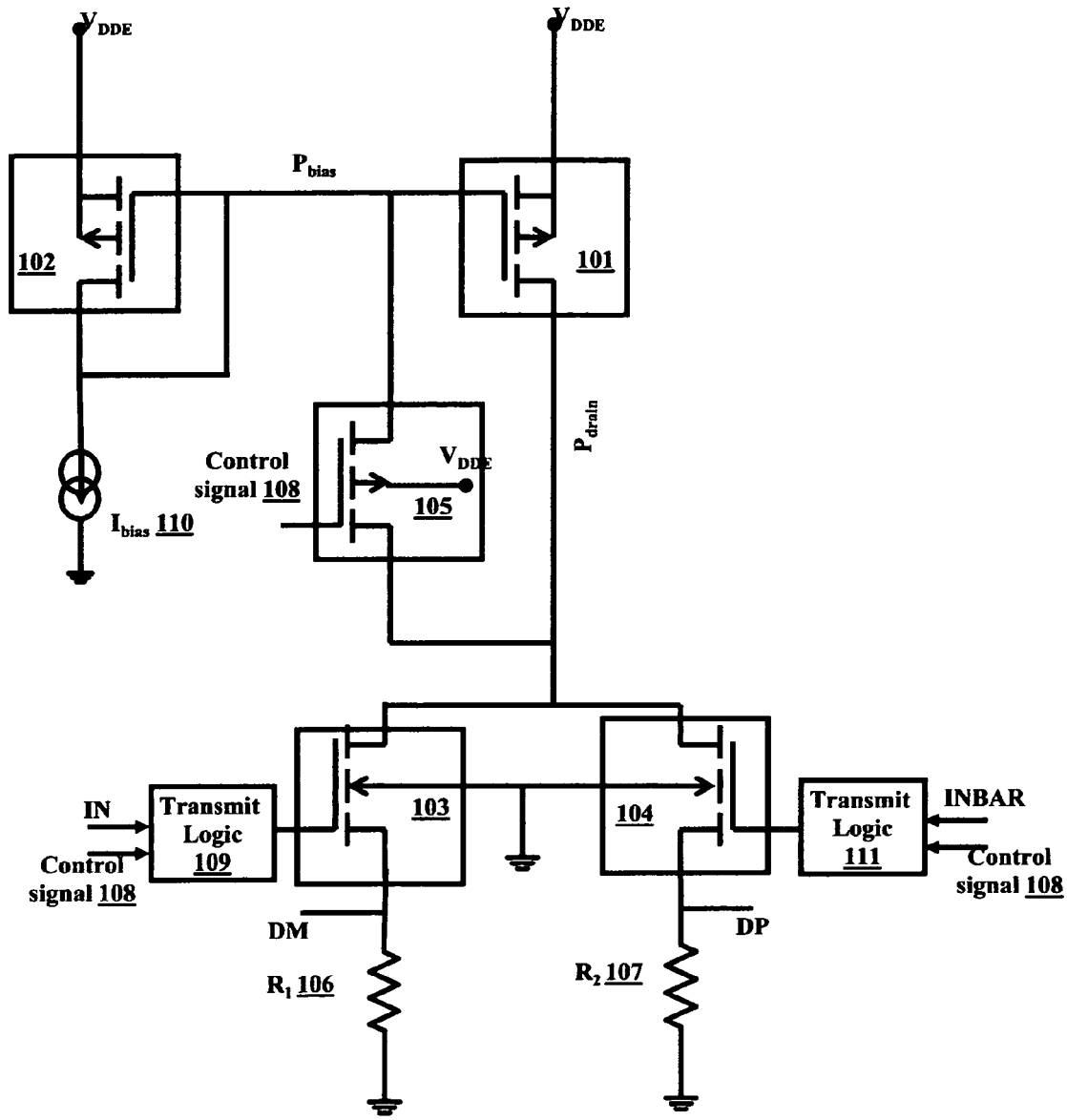
FIG. 1 illustrates a basic circuit for current switching, according to embodiments as disclosed herein.
Figure 2:
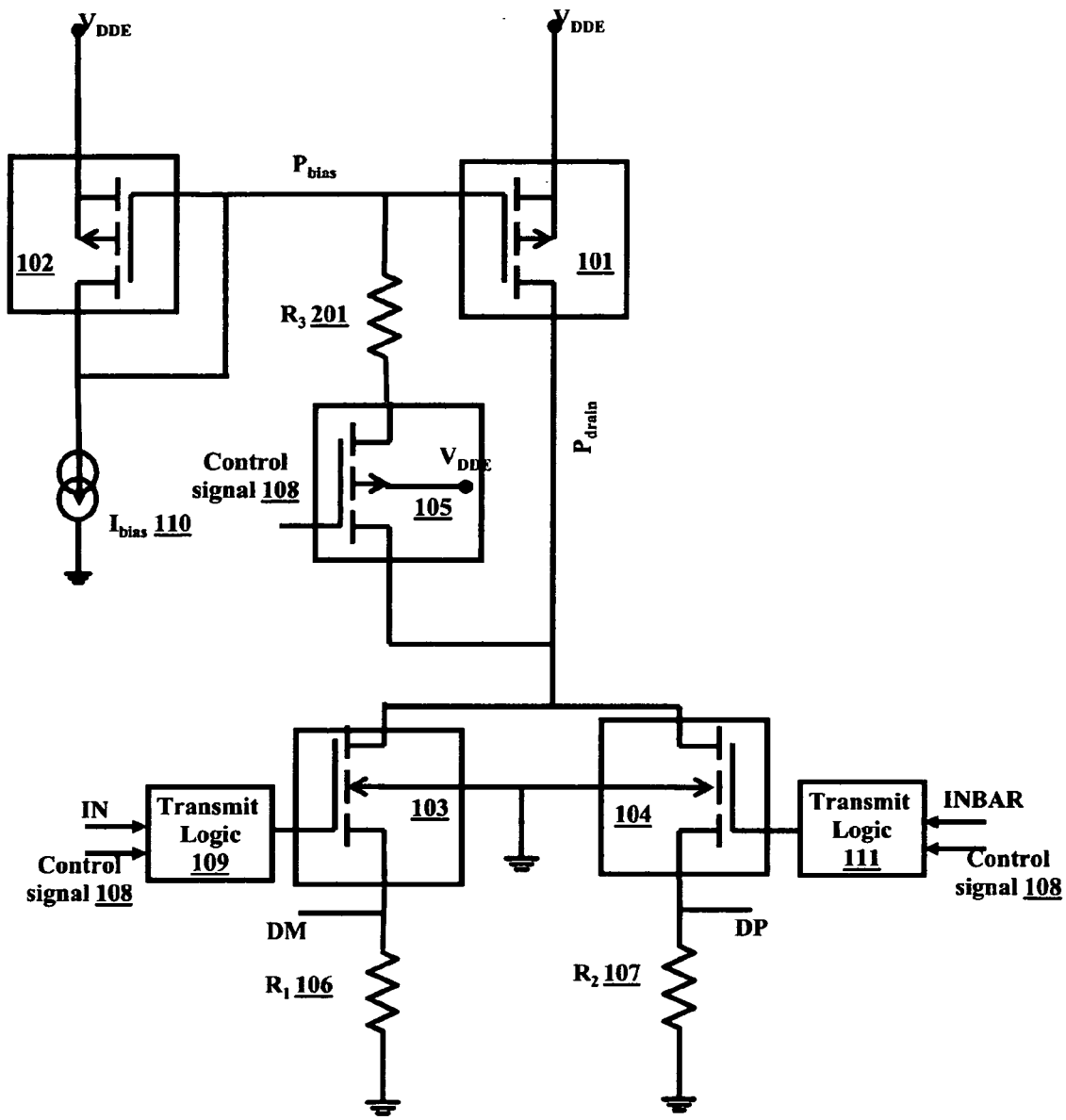
FIG. 2 illustrates the basic circuit for current switching with a resistive element, according to embodiments as disclosed herein.
Figure 3:
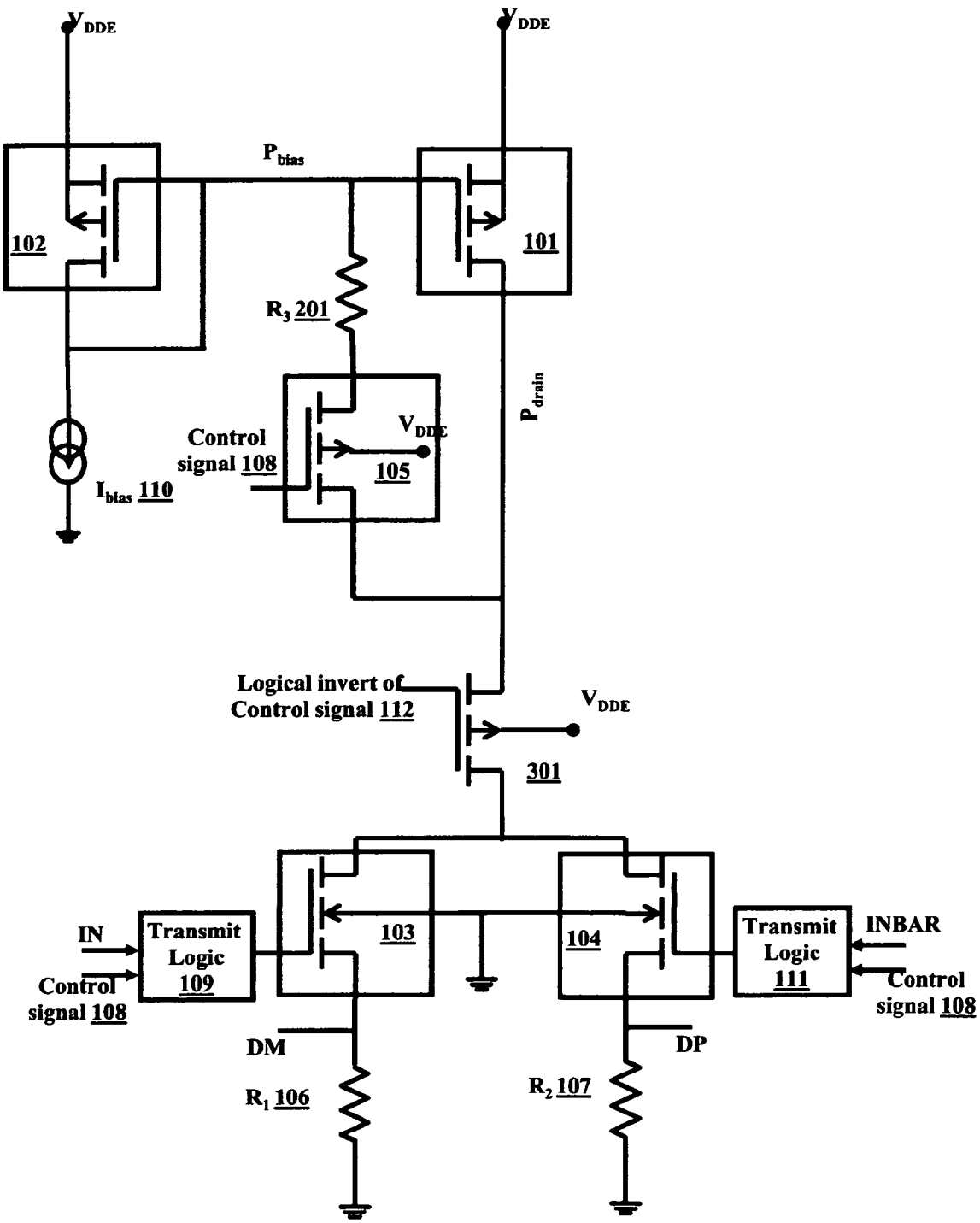
FIG. 3 illustrates the basic circuit for current switching with a cascode transistor, according to embodiments as disclosed herein.

The embodiments herein disclose means for high-speed current switching by providing circuit and method thereof. Referring now to the drawings, and more particularly to FIGS. 1 through 3, where similar reference characters denote corresponding features consistently throughout the figures, there are shown embodiments.

Methods and circuits for high-speed current switching are disclosed. The disclosed circuits employ high-speed current switching techniques to save power and enhance dynamic performance of high-speed links. This is achieved by the use of a resistor (or a transistor acting as a resistor). The resistive switching element (or a transistor) which can be Metal Oxide Semiconductor Field Effect Transistor (MOSFET) etc is connected between the gate and drain terminals of a Current Source MOSFET, which is also connected to two termination resistors by two current directing/routing transistors acting as switches, either directly or through a cascode transistor. A Current Mirroring MOSFET mirrors the bias current to the Current Source MOSFET and forms the bias leg. The resistor connection (or a transistor acting as a resistor connection), activated in the non-transmit mode with control signal going low, allows the current sunk in the bias leg (bias leg is on in both transmit and non-transmit mode) to be sourced from two diode transistors: the current mirror transistor and the Current Source transistor, thus raising the Gate to Source voltage of the two transistors and reducing the Drain to Source voltage of the CS to a few millivolts. During the transmit mode, the drain to gate path of the Current Source is switched OFF and the path to the termination resistors is switched ON. During this switching, gate voltage of the Current Source dips due to coupling of voltage dip in the drain node. Since gate voltage dip is already compensated for, by an increase in the gate voltage with resistor connection in non-transmit mode, Current Source starts providing the desired current in a few nanoseconds.

FIG. 1 illustrates a basic circuit for current switching, according to embodiments as disclosed herein. The circuit comprises of three P channel and two N channel transistors. The transistors 101, 102 and 105 are P channel transistors and transistors 103 and 104 are N channel transistors. Also, transistor 101 acts as a current source for the circuit, transistor 102 is the current mirroring diode, transistors 103 and 104 are current routing transistors that act as switches that direct the current from the transistor 101 to the output depending on the control signal 108 and the inputs to the circuit. The control signal 108 is also referred to as transmit_enable signal.

The source terminals of the transistor 101 and 102 are connected to the supply voltage $V_{DDE}$, and the gate terminals are shorted as node $P_{bias}$. The gate and drain terminals of transistor 102 are shorted and connected to a reference current source 110 i.e., $I_{bias}$. The drain terminal of the transistor 101 ($P_{drain}$) is a common connection to the drain terminals of the transistors 103 and 104. Further, the source terminals of the transistors 103 and 104 are connected to the termination resistors $R_1$ 106 and $R_2$ 107 forming the negative and positive terminals of the output. The gate terminal of the transistor 103 is controlled by the Transmit Logic, whose inputs are control signal 108 and the input signal IN. The gate terminal of the transistor 104 is controlled by the Transmit Logic, whose inputs are control signal 108 and the input signal INBAR. The control signal 108 and the input signals are suitably combined in a Transmit logic block 109. The gate terminal of the transistor 105 is controlled by the control signal 108. The source terminal of the transistor 105 is connected to the node $P_{drain}$ and the drain terminal is connected to the node $P_{bias}$.

When the control signal 108 is low (non-transmit mode), transistor 105 is turned on and acts as a resistor between the gate and the drain nodes of the transistor 101. In such a situation, the transmit path is disabled i.e., the current from the transistor 101 is not directed towards the output. When the control signal 108 is high (transmit mode), the transistor 105 is turned OFF and as a result, the resistive path (served by the transistor 105) between the gate and the node terminals of the transistor is cut off. The transmit path is thus enabled and the current from the transistor 101 is directed to the output of the circuit.

The gate terminal of transistor 105 being coupled to control signal 108 is responsible for directing current from the transistor 101 to $I_{bias}$ and acts as a resistive switch in the non-transmit mode. This creates a voltage drop across the transistor 105 and changes the drain and gate voltage of the transistor 101, drain and gate voltage of transistor 102, and the source and drain voltage of transistor 105. Thus, the gate to source and drain to source voltage of transistor 102 is reduced to decrease the current through transistor 102 and gate to source voltage of the transistor 101 is reduced (i.e., the voltage at node $P_{bias}$ is increased). Further, since the current sourced from Current Source transistor is less than bias current $I_{bias}$ ($I_{bias}$ less than one by four hundredth of transmit current), its drain to source voltage is reduced to nearly zero and considered OFF.

In the non-transmit mode, only Bias current ($I_{bias}$) is drawn from the supply and transmit current is zero. Instead of sourcing this bias current fully from Current mirroring transistor, this current $I_{bias}$ (which is approximately ¼₀₀th of the transmit current) is sourced from the Current Source transistor 101 (which is ~two hundred times the size of 102) and Current mirroring transistor 102, by the use of transistor 105, thus raising the gate bias ($P_{bias}$) node to compensate for the capacitive coupling during transition from non-transmit to transmit mode. The gate settling time is thus reduced to the order of 1-1.5 ns when the Current Source transistor is switched.

FIG. 2 illustrates the basic circuit for current switching with a resistive element, according to embodiments as disclosed herein. The circuit comprises of three P channel and two N channel transistors. The transistors 101, 102 and 105 are P channel transistors and transistors 103 and 104 are N channel transistors. Also, transistor 101 acts as a current source for the circuit, transistor 102 is the current mirroring diode, transistors 103 and 104 are current routing transistors that act as switches and direct the current from the transistor 101 to the output depending on the control signal 108 and the inputs to the circuit. In addition, a resistor $R_3$ 201 is connected between the node $P_{bias}$ and the drain terminal of transistor 105. $R_3$ 201 may be a poly/NWELL resistor. One terminal of $R_3$ 201 is coupled to gate terminal of the transistor 101, and the other terminal is connected to the drain terminal of transistor 105. Source of transistor 105 is connected to the drain of the 101 and its gate is connected to Control Signal 108.

The source terminals of the transistor 101 and 102 are connected to the supply voltage $V_{DDE}$, and the gate terminals are shorted and labeled as node $P_{bias}$. Transistor 102 is a current mirroring diode. The gate and drain terminals of transistor 102 are shorted and connected to a reference current source i.e., $I_{bias}$. The drain terminal of the transistor 101 (node $P_{drain}$) is a common connection to the drain terminals of the transistors 103 and 104. Further, the source terminals of the transistors 103 and 104 are connected to the termination resistors $R_1$ 106 and $R_2$ 107. The source terminal of transistor 103 is coupled to the termination resistor $R_1$ 106 and together they are connected to the negative terminal of the output. The source terminal of the transistor 104 is coupled to the termination resistor R₂ 107 and together they are connected to the positive terminal of the output. The gate terminal of the transistor 103 is controlled by the Transmit Logic, whose inputs are control signal 108 and the input signal IN. The gate terminal of the transistor 104 is controlled by the Transmit Logic, whose inputs are control signal 108 and the input signal INBAR. The control signal 108 and the input signals are suitably combined in a Transmit logic block 109. The gate terminal of the transistor 105 is controlled by the control signal 108. The source terminal of the transistor 105 is connected to the node P$_{drain}$ and the drain terminal of the transistor 105 is connected to the node P$_{bias}$.

When the control signal 108 goes low (non-transmit mode), transistor 105 is turns on and connects the resistor R3 between the gate and the drain nodes of the transistor 101. In such a situation, the transmit path is disabled i.e., the current from the transistor 101 is not directed towards the output. When the control signal 108 is high (transmit mode), the transistor 105 is turned OFF and the resistive path between the gate and the node terminals of the transistor is cut off. The transmit path is thus enabled and the current from the transistor 101 is now directed to the output of the circuit.

The current from the transistor 101 is directed to the drain of the transistor 102 through the resistor R₃ 201. When turned on in the non-transmit mode, Transistor 105 acts as a zero resistance switch so that there is voltage drop across R₃ 201, and change in the drain and gate voltage of the transistor 101 and drain and gate voltage of transistor 102. Further, since the current sourced from Current Source transistor is less than bias current I$_{bias}$ (I$_{bias}$ less than one by four hundredth of transmit current), its drain to source voltage is reduced to nearly zero.

In the non-transmit mode, only Bias current (I$_{bias}$) is drawn from the supply. Instead of sourcing this current fully from Current mirroring transistor, this current I$_{bias}$ (which is approximately ¼₀₀th of the transmit current) is sourced from the Current Source transistor 101 (which is approximately two hundred times the size of 102) and Current mirroring transistor 102, by the use of transistor 105, thus raising the gate bias (P$_{bias}$) node to compensate for the capacitive coupling during transition from non-transmit to transmit mode. The gate settling time is thus reduced to the order of 1-1.5 ns when Current Source is switched.

FIG. 3 illustrates the basic circuit for current switching with a cascode transistor, according to embodiments as disclosed herein. The circuit comprises of four P channel and two N channel transistors. The transistors 101, 102 and 105, 301 are P channel transistors and transistors 103 and 104 are N channel transistors. Also, transistor 101 acts as a current source and transistor 102 acts as current mirroring diode. Transistor 301 acts as a cascode to 101. The transistors 103 and 104 are switches that direct the current from the transistor 101 to the output depending on the control signal 108 and the inputs to the circuit. The control signal 108 is also referred to as transmit_enable 108 signal. The drain of 301 is connected to common drain terminals of transistors 103 and 104 and its source to the drain of 101. The gate terminal of 301 is controlled by a logical invert of control signal 108, called 112.

The source terminals of the transistor 101 and 102 are connected to the supply voltage V$_{DDE}$, and the gate terminals are shorted and labeled as node P$_{bias}$. Transistor 102 is a current mirroring diode whose gate and drain terminals are shorted and connected to a reference current source i.e., I$_{bias}$. The drain terminal of the transistor 101 is node P$_{drain}$. Further, the source terminals of the transistors 103 and 104 are connected to the termination resistors R₁ 106 and R₂ 107. The source terminal of transistor 103 is coupled to the termination resistor R₁ 106 and together they are connected to the negative terminal of the output. The source terminal of the transistor 104 is coupled to the termination resistor R₂ 107 and together they are connected to the positive terminal of the output. The gate terminal of the transistor 103 is controlled by the Transmit Logic, whose inputs are control signal 108 and the input signal IN. The gate terminal of the transistor 104 is controlled by the Transmit Logic, whose inputs are control signal 108 and the input signal INBAR. The control signal 108 and the input signals are suitably combined in a Transmit logic block 109. The gate terminal of the transistor 105 is controlled by the control signal 108. The source terminal of the transistor 105 is connected to the node P$_{drain}$ and drain terminal is connected to the node P$_{bias}$.

When the control signal 108 is low (non-transmit mode), transistor 105 is turns on and connects the resistor R3 between the gate and the drain nodes of the transistor 101. In such a situation, the transmit path is disabled i.e., the current from the transistor 101 is not directed towards the output. In a second functionality, when the control signal 108 is high (transmit mode), the transistor 105 is turned off. As a result, the resistive path between the gate and the drain terminals of the transistor is cut off. The transmit path is enabled and the current from the transistor 101 is directed to the output of the circuit, through the cascode transistor 301.

The current from the transistor 101 is directed to the drain of the transistor 102 through the resistor R₃ 201. When turned on in the non-transmit mode, Transistor 105 acts as a zero resistance switch so that there is voltage drop across R₃ 201, and change in the drain and gate voltage of the transistor 101 and drain and gate voltage of transistor 102. Further, since the current sourced from Current Source transistor is less than bias current I$_{bias}$ (I$_{bias}$ less than one by four hundredth of transmit current), its drain to source voltage is reduced to nearly zero.

In the non-transmit mode, only Bias current (I$_{bias}$) is drawn from the supply. Instead of sourcing this current fully from Current mirroring transistor, this current I$_{bias}$ (which is approximately ¼₀₀th of the transmit current) is sourced from the Current Source transistor 101 (which is approximately 200 times the size of 102) and Current mirroring transistor 102, by the use of transistor 105, thus raising the gate bias (P$_{bias}$) node to compensate for the capacitive coupling during transition from non-transmit to transmit mode. The gate settling time is further reduced by cascode transistor 301 which reduces the capacitive coupling to node P$_{bias}$ In light of all the above, the gate settling time is reduced to the order of 1-1.5 ns.

Embodiments disclosed herein disclose a high-speed switching circuit using P-MOSFETs. It may be obvious to a person of ordinary skill in the art that a similar high-speed switching circuit may be designed using N-MOSFETs. However, the high-speed switching circuit designed using P-MOSFETs are complimentary to the high-speed switching using N-MOSFETs.

In an embodiment, the circuit facilitates rapid turn on or off of a current source or sink. For example, the circuit can switch large currents of the order of tens of milliamperes with 2% accuracy in the bias voltage within 1.5 nano seconds. Some of the areas of application of the circuit may be high-speed I/Os like, USB 2.0, Digital to Analog (DAC) converters, current mode transmitters and other applications that involve high-speed current switching. In addition, embodiments as disclosed herein are simple in implementation and consume lesser area compared to other circuits.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the claims as described herein.

What is claimed is:

1. A high-speed current switching circuit comprising of a first Metal-Oxide Semiconductor Field Effect Transistor (MOSFET) acting as a resistive element, a second MOSFET acting as a Current source/sink, a third MOSFET acting as a Current Mirroring element and a plurality of transistors and resistors wherein
    a drain terminal of said first MOSFET is connected to gate terminals of said second and third MOSFETs and drain terminal of said third MOSFET;
    a gate terminal of said first MOSFET is connected to a control signal; and
    a source terminal of said first MOSFET is connected to the drain terminal of said second MOSFET,
    wherein said first MOSFET, said second MOSFET and said third MOSFET are same type MOSFETs.

2. The high-speed current switch circuit as claimed in claim 1, wherein said control signal is a transmit enable signal.

3. The high-speed current switch circuit as claimed in claim 1, wherein at least two of said MOSFETs are connected to a transmit logic block.

4. The high-speed current switch circuit as claimed in claim 1, wherein at least two of said MOSFETs are connected to termination resistors.

5. The high-speed current switch circuit as claimed in claim 1, wherein drain and gate terminals of said third MOSFET are connected to a reference bias current sink/source.

6. The high-speed current switch as claimed in claim 1, wherein said first, second and third MOSFETs are P channel MOSFETs.

7. The high-speed current switch as claimed in claim 1, wherein said first, second and third MOSFETs are N channel MOSFETs.

8. A high-speed current switching circuit comprising of a first resistor, a first Metal-Oxide Semiconductor Field Effect Transistor (MOSFET) acting as a switch, a second MOSFET acting as a Current source/sink, a third MOSFET acting as a Current Mirroring element and a plurality of resistors wherein
    one terminal of said first resistor is connected to a drain terminal of said first MOSFET;
    other terminal of said first resistor is connected to gate terminals of said second and third MOSFETs and drain terminal of said third MOSFET;
    a gate terminal of said first MOSFET is connected to a control signal; and
    a source terminal of said first MOSFET is connected to the drain terminal of said second MOSFET,
    wherein said first MOSFET, said second MOSFET and said third MOSFET are same type MOSFETs.

9. The high-speed current switch circuit as claimed in claim 8, wherein said control signal is a transmit enable signal.

10. The high-speed current switch circuit as claimed in claim 8, wherein said first MOSFET exhibits zero ON resistance.

11. The high-speed current switch circuit as claimed in claim 8, wherein said first resistor is a poly resistor or nwell resistor.

12. The high-speed current switch circuit as claimed in claim 8, wherein at least two of said MOSFETs are connected to a transmit logic block.

13. The high-speed current switch circuit as claimed in claim 8, wherein at least two of said MOSFETs are connected to termination resistors.

14. The high-speed current switch circuit as claimed in claim 8, wherein drain and gate terminals of said third MOSFET are connected to a reference bias current sink/source.

15. The high-speed current switch as claimed in claim 8, wherein said first, second and third MOSFETs are P channel MOSFETs.

16. The high-speed current switch as claimed in claim 8, wherein said first, second and third MOSFETs are N channel MOSFETs.

17. A high-speed current switching circuit comprising of a first resistor, a first Metal-Oxide Semiconductor Field Effect Transistor (MOSFET) acting as a switch, a second MOSFET acting as a Current source/sink, a third MOSFET acting as a Current Mirroring element, a fourth MOSFET and a plurality of resistors wherein
    one terminal of said first resistor is connected to the drain terminal of said first MOSFET;
    the other terminal of said first resistor is connected to gate terminals of the said second and third MOSFETs and drain terminal of third MOSFET;
    a gate terminal of said first MOSFET is connected to a control signal;
    a source terminal of said first MOSFET is connected to the drain terminal of said second MOSFET;
    a source terminal of said fourth MOSFET is connected to drain terminal of said second MOSFET;
    a gate terminal of said fourth MOSFET is connected to a logical invert of said control signal; and
    a drain terminal of said fourth MOSFET is connected to drain terminals of at least two MOSFETs whose source terminals are connected to termination resistors,
    wherein said first MOSFET, said second MOSFET and said third MOSFET are same type MOSFETs.

18. The high-speed current switch circuit as claimed in claim 17, wherein said fourth MOSFET acts as a cascode transistor to said second MOSFET.

19. The high-speed current switch circuit as claimed in claim 17, wherein said control signal is a transmit enable signal.

20. The high-speed current switch circuit as claimed in claim 17, wherein said first MOSFET exhibits zero ON resistance.

21. The high-speed current switch circuit as claimed in claim 17, wherein said first resistor is a poly resistor or nwell resistor.

22. The high-speed current switch circuit as claimed in claim 17, wherein at least two of said MOSFETs are connected to a transmit logic block.

23. The high-speed current switch circuit as claimed in claim 17, wherein at least two of said MOSFETs are connected to termination resistors.

24. The high-speed current switch circuit as claimed in claim 17, wherein drain and gate terminals of said third MOSFET are connected to a reference bias current sink/source.

25. A method to enable high-speed current switching, said method comprising:
- a control signal turning a first MOSFET on when a Current source/sink is not sourcing the full current;
- said first MOSFET raising gate voltage of said Current source/sink, wherein raise/dip in said gate voltage compensates for the dip/raise in said gate voltage due to coupling between said gate and drain of said current source/sink when said current source/sink starts sourcing/sinking the full current.

26. The method as claimed in claim 25, wherein said first MOSFET is a P channel MOSFET.

27. The method as claimed in claim 25, wherein said first MOSFET is an N channel MOSFET.

28. The method as claimed in claim 25, wherein said Current source/sink is a P channel MOSFET.

29. The method as claimed in claim 25, wherein said Current source/sink is an N channel MOSFET.

30. The method as claimed in claim 25, wherein a resistor is used in series with said MOSFET to reduce variations.

* * * * *